United States Patent
Han et al.

(10) Patent No.: US 11,430,705 B2
(45) Date of Patent: Aug. 30, 2022

(54) DISPLAY PANEL AND METHOD OF MANUFACTURING THEREOF

(71) Applicant: SAMSUNG ELECTRONICS CO., LTD., Suwon-si (KR)

(72) Inventors: Seungryong Han, Suwon-si (KR); Sangmoo Park, Suwon-si (KR); Hyunsun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 16/845,485

(22) Filed: Apr. 10, 2020

(65) Prior Publication Data

US 2020/0328196 A1 Oct. 15, 2020

(30) Foreign Application Priority Data

Apr. 10, 2019 (KR) .................. 10-2019-0041948

(51) Int. Cl.
*H01L 21/66* (2006.01)
*H01L 25/16* (2006.01)
(Continued)

(52) U.S. Cl.
CPC ............ *H01L 22/22* (2013.01); *G09G 3/006* (2013.01); *G09G 3/32* (2013.01); *H01L 25/0753* (2013.01);
(Continued)

(58) Field of Classification Search
CPC . H01L 22/22; H01L 25/0753; H01L 33/0095; H01L 33/60; H01L 33/62;
(Continued)

(56) References Cited

U.S. PATENT DOCUMENTS

| 7,943,491 B2 | 5/2011 | Nuzzo et al. |
| 9,858,886 B2 | 1/2018 | Bae et al. |

(Continued)

FOREIGN PATENT DOCUMENTS

| JP | 2010-72216 A | 4/2010 |
| KR | 10-2013-0143420 A | 12/2013 |

(Continued)

OTHER PUBLICATIONS

International Search Report dated Jul. 15, 2020 issued by the International Searching Authority in counterpart International Application No. PCT/KR2020/004777 (PCT/ISA/210).

(Continued)

*Primary Examiner* — Aaron J Gray
(74) *Attorney, Agent, or Firm* — Sughrue Mion, PLLC

(57) ABSTRACT

A display panel and a method of manufacturing thereof are provided. The method of manufacturing a display panel includes forming a driving circuit on a substrate; forming an electrode, including a first area and a second area therewith, on the driving circuit; mounting a first micro Light Emitting Diode (LED), for forming a sub pixel, on the first area; forming an absorption layer on the second area, the absorption layer configured to absorb an external light; removing, based on the sub pixel being defective, the absorption layer; and mounting a second micro LED on the second area after removing the absorption layer.

6 Claims, 20 Drawing Sheets

(51) Int. Cl.
    *H01L 33/62*     (2010.01)
    *H01L 25/075*     (2006.01)
    *H01L 27/15*     (2006.01)
    *G09G 3/32*     (2016.01)
    *G09G 3/00*     (2006.01)
    *H01L 33/00*     (2010.01)

(52) U.S. Cl.
    CPC .......... *H01L 25/167* (2013.01); *H01L 27/156* (2013.01); *H01L 33/62* (2013.01); *G09G 2330/08* (2013.01); *G09G 2330/10* (2013.01); *H01L 33/0095* (2013.01)

(58) Field of Classification Search
    CPC .... H01L 2933/0058; H01L 2933/0066; G09G 3/006; G09G 2330/08; G09G 2330/10; G09G 3/32
    See application file for complete search history.

(56) References Cited

U.S. PATENT DOCUMENTS

| | | |
|---|---|---|
| 2015/0154933 A1 | 6/2015 | Bae et al. |
| 2016/0351092 A1 | 12/2016 | Chen et al. |
| 2016/0351539 A1* | 12/2016 | Bower .................. H01L 25/167 |
| 2016/0351548 A1 | 12/2016 | Chen et al. |
| 2017/0186740 A1* | 6/2017 | Cok ....................... H01L 25/167 |
| 2018/0210282 A1 | 7/2018 | Song et al. |
| 2018/0323116 A1* | 11/2018 | Wu ..................... H01L 33/0095 |
| 2019/0080970 A1 | 3/2019 | Chaji |
| 2020/0058834 A1* | 2/2020 | Park ........................ H01L 33/56 |

FOREIGN PATENT DOCUMENTS

| | | |
|---|---|---|
| KR | 10-2015-0064469 A | 6/2015 |
| KR | 10-2018-0087502 A | 8/2018 |
| KR | 10-1890934 B1 | 8/2018 |

OTHER PUBLICATIONS

International Written Opinion dated Jul. 15, 2020 issued by the International Searching Authority in counterpart International Application No. PCT/KR2020/004777 (PCT/ISA/237).

* cited by examiner

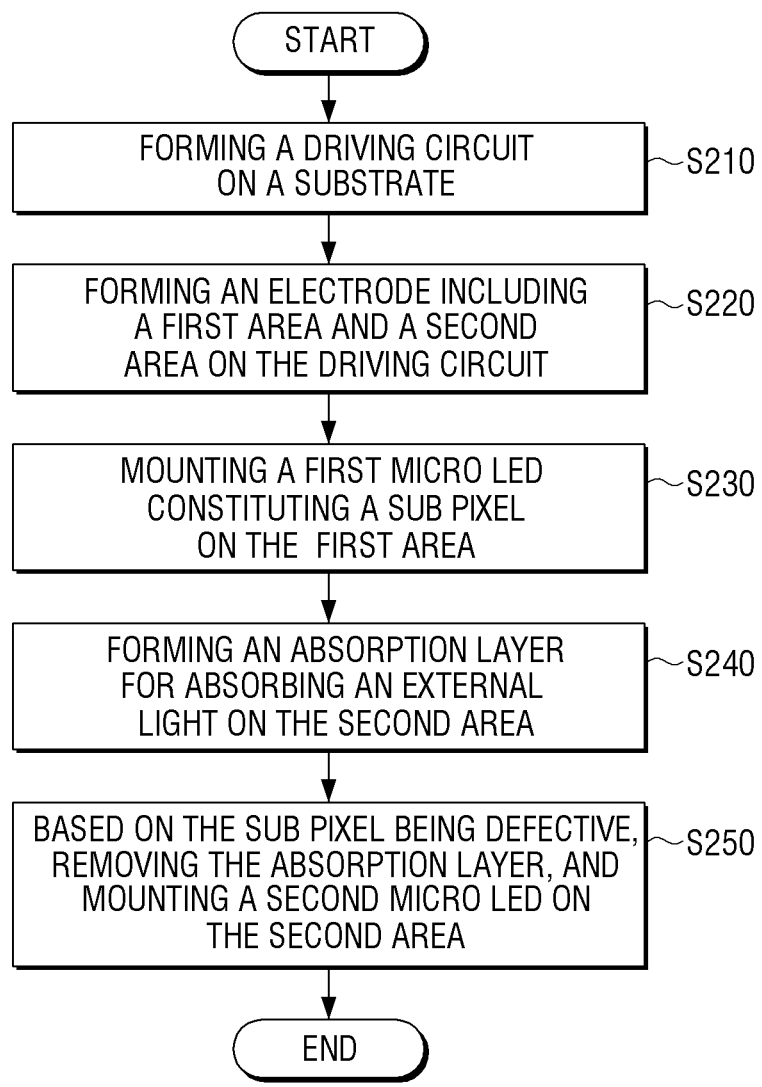

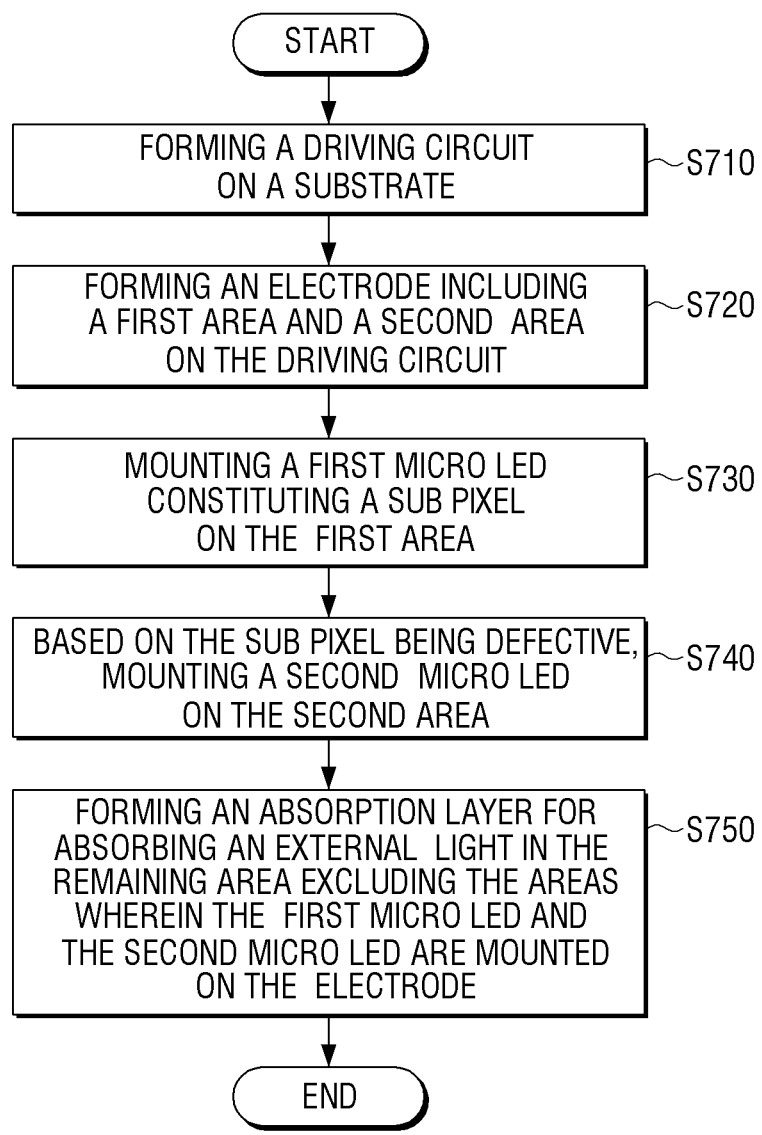

DISPLAY PANEL AND METHOD OF MANUFACTURING THEREOF

CROSS-REFERENCE TO THE RELATED APPLICATION

This application claims priority under 35 U.S.C. § 119(a) of Korean Patent Application No. 10-2019-0041948, filed on Apr. 10, 2019 in the Korean Intellectual Property Office, the disclosure of which is incorporated by reference herein in its entirety.

BACKGROUND

1. Field

The disclosure relates to a display panel and a method of manufacturing thereof, and more particularly, to a display panel for compensating defective pixels and a method of manufacturing thereof.

2. Description of Related Art

A light emitting diode (LED) is a semiconductor device that emits a light when a voltage is applied, and it is being used widely not only as a general illuminating device but also as a light source of a display panel for displaying images. Recently, a display panel using a micro LED (μ-LED) as a light source is being developed.

A display panel to which a micro LED (mLED or μ-LED) is applied is a kind of flat display panels, and consists of a plurality of inorganic LEDs, each of which is in a size of smaller than or equal to 100 micrometers. Compared to a liquid crystal display (LCD) panel which needs a backlight, a micro LED display panel provides better contrast, response time, and energy efficiency. Both of an organic LED and a micro LED have good energy efficiency, but a micro LED has better brightness and light emitting efficiency, and a longer lifespan than an OLED.

Specifically, a micro LED has advantages that, as it emits a light by using an inorganic substance, there are few burn-in phenomena and the lifespan is long, and is easy to be enlarged through a tiling arrangement in module units or manufactured into a display panel in a user-customized size, and by virtue of a short current passage, the amount of heat emission is small and can be driven by a low power.

Also, as a micro LED is a micro-size self-emitting device, it may be driven independently in a pixel unit (or a sub pixel unit constituting a pixel) constituting an image. For this, for a display panel of a high resolution, it is required that the size of a micro LED is miniaturized and the distance between micro LEDs (i.e., a pitch) is reduced. For example, in the case of a display panel of an UHD standard (a pixel number of 3840×2160), approximately 25,000,000 micro LEDs may be required.

For this, on a substrate of a display panel, micro LEDs may be mounted through transferring and bonding processes, and here, a defect in the device itself or a procedural defect that occurs during transferring and bonding may exist. In a display panel having such defects, there is a problem that defective pixels/missing pixels such as a dead pixel wherein all of RGB sub pixels are not formed and the pixel is displayed in a black color, a hot pixel wherein all of RGB sub pixels are formed and the pixel is displayed in a white color, a stuck pixel wherein one or two of RGB sub pixels are not driven and the pixel is displayed in a specific color, etc. may be formed.

As a method for resolving this problem, in case a defective pixel exists, micro LEDs forming the defective pixel may be removed, and new micro LEDs may be mounted again in the locations wherein micro LEDs have been removed.

Meanwhile, in the process of removing micro LEDs, there are problems that a damage to the substrate may occur, or a foreign substance remains on an electrode pad and a defective contact may occur accordingly, or a turn-on yield rate may become lower. Also, even if new micro LEDs are mourned, there may be problems that a portion of an electrode pad is exposed and degradation of the contrast ratio due to reflection by an external light may occur, or an electro-static discharge (ESD) problem may occur.

SUMMARY

According to one or more embodiments, a method of manufacturing a display panel is provided, the method including: forming a driving circuit on a substrate; forming an electrode, including a first area and a second area, on the driving circuit; mounting a first micro Light Emitting Diode (LED), for forming a sub pixel, on the first area; forming an absorption layer on the second area, the absorption layer configured to absorb an external light; removing, based on the sub pixel being defective, the absorption layer; and mounting a second micro LED on the second area after removing the absorption layer.

According to n embodiment, the method further includes removing the first micro LED; and forming the absorption layer on the first area exposed due to removal of the first micro LED.

According to an embodiment, the second micro LED is configured to emit a light of a same color as light in which the first micro LED is configured to emit when the first micro LED is in a state to form the sub pixel without defect.

According to an embodiment, a size of the electrode is bigger than a size of the first micro LED, and the first area and the second area are electronically connected with each other.

According to an embodiment, the electrode includes a first electrode and a second electrode, and the first electrode and the second electrode are both arranged across the first area and the second area.

According to an embodiment, the first electrode is a common electrode commonly connected with another micro LED for forming a pixel together with the first micro LED, and the second electrode is arranged adjacent to the first electrode.

According to an embodiment, the first electrode and the second electrode are arranged in parallel with a plurality of electrodes connected with another micro LED for forming a pixel together with the first micro LED.

According to one or more embodiments, a method of manufacturing a display panel is provided, the method including, forming a driving circuit on a substrate; forming an electrode, including a first area and a second area, on the driving circuit; mounting a first micro Light Emitting Diode (LED) for forming a sub pixel on the first area; mounting, based on the sub pixel being defective, a second micro LED on the second area; and forming an absorption layer on an area other than where the first micro LED and the second micro LED are mounted on the electrode, the absorption layer configured to absorb an external light.

According to an embodiment, the second micro LED is configured to emit a light of a same color as light of which the first micro LED is configured to emit when the first micro LED is in a state to form the sub pixel without defect.

According to an embodiment, a size of the electrode is bigger than a size of the first micro LED, and the first area and the second area are electronically connected with each other.

According to an embodiment, the electrode includes a first electrode and a second electrode, the first electrode and the second electrode are both arranged across the first area and the second area.

According to an embodiment, the first electrode is a common electrode commonly connected with another micro LED for forming a pixel together with the first micro LED, and the second electrode is arranged adjacent to the first electrode.

According to one or more embodiments, a display panel including a plurality of pixels is provided, the display panel including: a driving circuit; an electrode formed on the driving circuit, the electrode including a first area and a second area; a first micro Light Emitting Diode (LED) mounted on the first area; a second micro LED mounted on the second area; and an absorption layer formed on an area other than where the first micro LED, and the second micro LED are mounted on the electrode, the absorption layer configured to absorb an external light, wherein a pixel from among the plurality of pixels includes a plurality of sub pixels, and the second micro LED, based on a sub pixel corresponding to the first micro LED from among the plurality of sub pixels being defective, is mounted on the second area so as to be configured to form the sub pixel, and constitutes the pixel together with other sub pixels from among the plurality of sub pixels.

According to an embodiment, the second micro LED forms the sub pixel that corresponded to the first micro LED, and the sub pixel formed by the second micro LED constitutes the pixel together with the other sub pixels.

According to an embodiment, the driving circuit includes a plurality of switching elements, the plurality of switching elements configured to respectively control the second micro LED, that is configured to form the sub pixel from among the plurality of sub pixels, and other micro LEDs configured to form the other sub pixels from among the plurality of sub pixels.

According to an embodiment, the second micro LED is configured to emit a light of a same color as light of which the first micro LED is configured to emit when the first micro LED is in a state to form the sub pixel without defect.

According to an embodiment, a size of the electrode is bigger than a size of the first micro LED, and the first area and the second area are electronically connected with each other.

According to an embodiment, the electrode includes a first electrode and a second electrode, and the first electrode and the second electrode are each arranged across the first area and the second area.

According to an embodiment, the first electrode is a common electrode commonly connected with another micro LED for forming, the pixel together with the first micro LED, such that the another micro LED and the second micro LED, together, are configured to form the pixel, and the second electrode is arranged, to be adjacent to the first electrode.

According to an embodiment, the first electrode and the second electrode are arranged in parallel with a plurality of electrodes connected with another micro LED for forming the pixel together with the first micro LED, such that the another micro LED and the second micro LED, together, are configured to form the pixel.

BRIEF DESCRIPTION OF THE DRAWINGS

FIG. 2 is a flow chart for illustrating a method of manufacturing a display panel according to an embodiment of the disclosure;

FIG. 7 is a diagram for illustrating a method of manufacturing a display panel according to another embodiment of the disclosure;

DETAILED DESCRIPTION

Figure 1A:
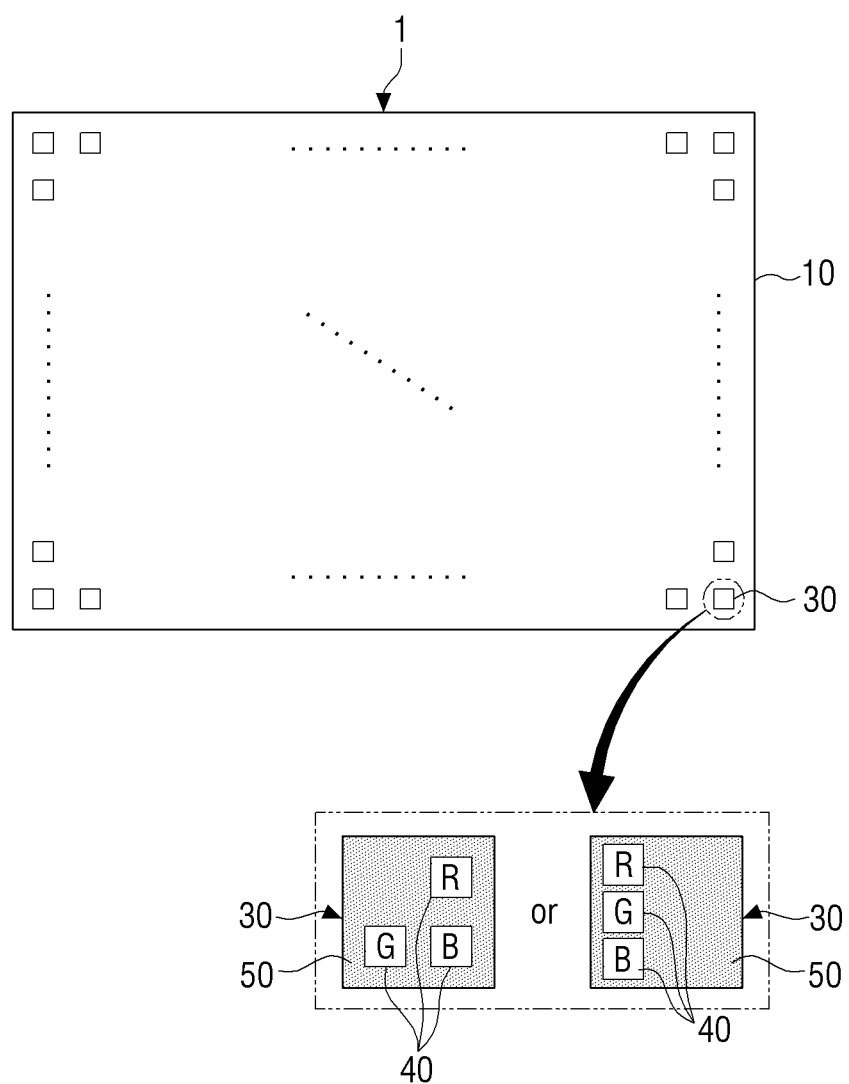
FIG. 1A is a diagram for illustrating a display panel according to an embodiment of the disclosure.

One or more embodiments of the disclosure were devised kw addressing the aforementioned need, and one or more embodiments of the disclosure provide a display panel for compensating defective pixels and a method of manufacturing thereof.

In describing embodiments of the disclosure, in case it is determined that detailed explanation of related known functions or components may unnecessarily confuse the gist of the disclosure, the detailed explanation will be omitted. In addition, the embodiments below may be modified in various different forms, and the scope of the technical idea of the disclosure is not limited to the embodiments below. Rather, these embodiments are provided to make the disclosure more sufficient and complete, and to fully convey the technical idea of the disclosure to those skilled in the art.

Also, it should be noted that the various embodiments of the disclosure are not for limiting the technology described in the disclosure to a specific embodiment, but they should be interpreted to include various modifications, equivalents, and/or alternatives of the embodiments of the disclosure. In addition, with respect to the detailed description of the drawings, similar components may be designated by similar reference numerals.

Further, the expressions "first," "second" and the like used in the disclosure may be used to describe various elements regardless of any order and/or degree of importance. Also, such expressions are used only to distinguish one element from another element, and are not intended to limit the elements.

Also, in the disclosure, the expressions "A and/or B," "at least one of A and/or B," or "one or more of A and/or B" and the like may include all possible combinations of the listed items. For example, "A or B," "at least one of A and B" or "at least one of A or B" refer to all of the following cases: (1) including at least one A, (2) including at least one B, or (3) including at least one A and at least one B.

Meanwhile, in the disclosure, singular expressions include plural expressions, unless defined obviously differently, in the context. Further, in this specification, terms such as "include" and "comprise of" should be construed as designating that there are such characteristics, numbers, steps, operations, elements, components or a combination thereof in the specification, but not as excluding in advance the existence or possibility of adding one or more of other characteristics, numbers, steps, operations, elements, components or a combination thereof.

Also, descriptions in the disclosure that one element (e.g.: a first element) is "(operatively or communicatively) coupled with/to" or "connected to" another element (e.g.: a second element) should be interpreted to include both the case where the one element is directly coupled to the another element, and the case where the one element is coupled to the another element through still another element (e.g.: a third element). In contrast, the description that one element (e.g.: a first element) is "directly coupled" or"directly connected" to another element (e.g.: a second element) can be interpreted to mean that still another element (e.g.: third element) does not exist between the one element and the another element.

In addition, the expression "configured to" used in the disclosure may be interchangeably used with other expressions such as "suitable for," "having the capacity to," "designed to," "adapted to," "made to," and "capable of," depending on cases. Meanwhile, the term "configured to" does not necessarily mean that a device is "specifically designed to" in terms of hardware. Instead, under some circumstances, the expression "a device configured to" may mean that the device "is capable of" performing an operation together with another device or component. For example, the phrase "a processor configured to perform A, B, and C" may mean a dedicated processor an embedded processor) for performing the corresponding operations, or a generic-purpose processor (e.g.: a CPU or an application processor) that can perform the corresponding operations by executing one or more software programs stored in a memory device.

Hereinafter, various embodiments of the disclosure will be described in detail with reference to the accompanying drawings.

Figure 1B:
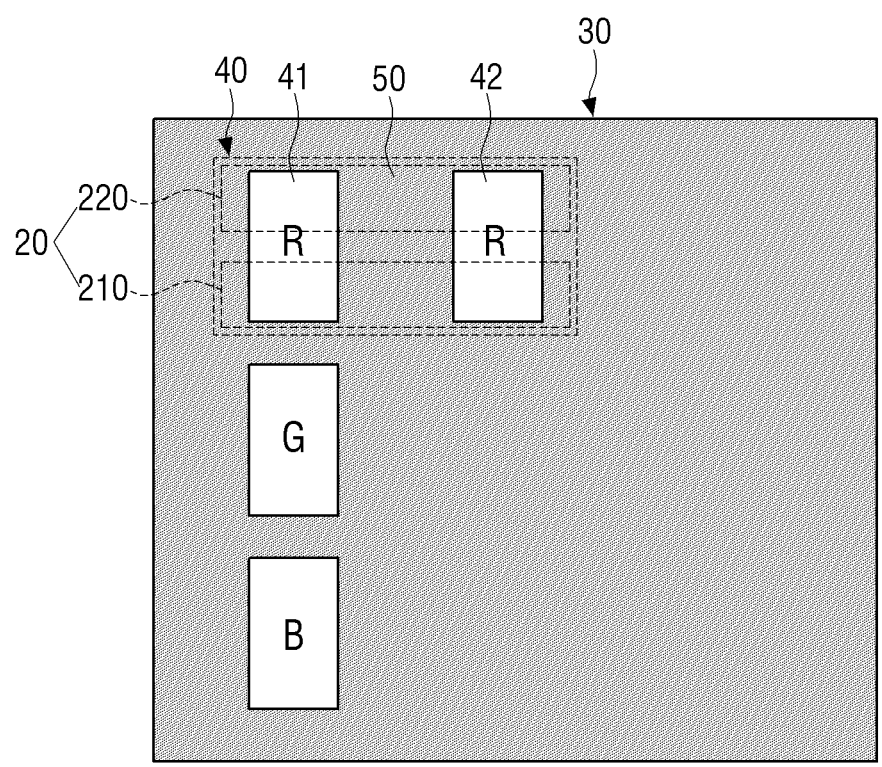
FIG. 1B is a plan view for illustrating the display panel according to the embodiment of the disclosure in more detail.

FIGS. 1A and 1B are diagrams for illustrating a display panel according to an embodiment of the disclosure.

Referring to FIG. 1A, the display panel may include a circuit board 10 and a plurality of pixel 30. Here, the pixel 30 may refer to a minimum unit for forming an image in case a light source (e.g., a micro LED) of the display panel 1 emits a light and an image is visually displayed through the light emitted from the light source. Also, the pixel 30 has the same structure and function as those of another pixel from among the plurality of pixels, and thus explanation regarding the pixel 30 can be applied in the same way to another pixel.

The display panel 1 is a display device and may operate to display an image. However, this is merely an example, and the display panel 1 may operate such that it is connected with another display panel as one of a plurality of display panels and displays an image.

The circuit board 10 may include a substrate 110 (refer to FIG. 1C) and a driving circuit 120 (refer to FIG. 1C), and may provide a space wherein a micro LED is mounted. The circuit board 10 may electronically connect the driving circuit 120 and a micro LED to electronically operate the micro LED according to a driving signal of the driving circuit 120.

The circuit board 10 may be implemented in a form of a small plate of which height is small compared to the width and the length of the small plate, and may be implemented as materials having various properties such as a transparent property or a bending property. For example, the circuit board 10 may comprise or consist of materials having a thickness of smaller than or equal to 1 mm which include polyimide (PI), polyethylene terephthalate (PET), metal foil, polyvinyl chloride (PVC), polymethyl methacrylate (PMMA), etc.

The pixel 30 may be arranged in a plurality of numbers (i.e. multiple pixels) in the form of a matrix in a first direction (e.g.: the horizontal direction) and a second direction (e.g.: the vertical direction) perpendicular to the first direction in the upper part of the circuit board 10. In this case, the number of rows and the number of columns of the matrix may be the same (e.g., in case M=N, 1×1 arrangement, 2×2 arrangement, etc., and here, M and N are natural numbers), or the number of rows and the number of columns may be different (e.g., in case M≠N, 2×3 arrangement, 3×4 arrangement, etc., and here, M and N are natural numbers).

Each pixel 30 may include a plurality of sub pixels 40. Here, each of the plurality of sub pixels 40 is a subordinate unit constituting the pixel 30, and may comprise or consist of a micro LED (not shown). For example, the sub pixels 40 may be formed by lights emitted from micro LEDs, and may display specific colors and brightness as one of the three primary colors of lights (e.g., red, green, blue).

Here, a micro LED may refer to a semiconductor light emitting device of which width, length, and height respectively have a size of greater than or equal to 1 µm and smaller than or equal to 100 µm. Also, a micro LED may comprise or consist of a flip-chip structure wherein an electrode (not shown) is formed on the bottom surface of the flip-chip structure.

A micro LED may be one of an LED emitting a red (R) light (hereinafter, referred to as a red LED), an LED emitting a green (G) light (hereinafter, referred to as a green LED), or an LED emitting a blue (B) light (hereinafter, referred to as a blue LED). In this case, by a combination of lights emitted from each of a red LED, a green LED, and a blue LED, a pixel 30 displaying a specific color and brightness may be constituted.

In FIG. 1 and the aforementioned embodiment, it was described that the pixel 30 may comprise or consist of three sub pixels 40. However, this is merely an example, and the number, arrangements, structures, colors, etc. of sub pixels can be changed in various ways according to various forms of layouts such as a diamond form, a delta form, a stripe form, an RGBW form, an RGBY form, a pentile form, a quad form, a mosaic form, etc. Accordingly, the number, arrangements, structures, colors, etc. of micro LEDs for forming sub pixels may also be changed in various ways.

Meanwhile, a micro LED according to embodiments of the disclosure may constitute one of the sub pixels 40, and for example, may emit a light having a specific color and brightness according to a driving signal of the driving circuit 120.

For this, a micro LED may be mounted on an electrode 20 (refer to FIG. 1C) of the driving circuit 120 formed on the substrate 110 such that it is electronically connected with the driving circuit 120.

In this case, in a micro LED, a defect in the device itself such as an epi defect, a defect that occurs during manufacture of a chip, etc. may exist, or a procedural effect according to a procedural error that occurs in processes of transferring a micro LED on the electrode 20 of the driving circuit 120 and bonding the micro LED may occur. Due to such defects (e.g.: missing, open, or short, etc.), a sub pixel constituted by a micro LED may become defective. For example, in case a sub pixel is defective, the sub pixel may always be displayed only in black.

The display panel 1 according to an embodiment of the disclosure may mount an additional (or preliminary) micro LED on the electrode 20 of the driving circuit 120 in case a sub pixel constituted by the micro LED is defective, and thereby constitute a normal sub pixel.

For this, in order that a plurality of micro LEDs emitting lights of the same color can be mounted on the electrode 20 of the driving circuit 120, the size of the electrode 20 may be enlarged than in a case wherein one micro LED is mounted. Hereinafter, a micro LED that is initially mounted will be referred to as a first micro LED 41 (refer to FIG. 1C), and a micro LED that is mounted in case a sub pixel constituted by the first micro LED 41 is defective will be referred to as a second micro LED 42 (refer to FIG. 1C). Here, the second micro LED 42 may be an LED emitting a light of the same color as the first micro LED 41. In other words, the second micro LED 42 may emit the light of the same color as light of which the first micro LED 41 is configured to emit when the first micro LED 41 is in a state to form the sub pixel without defect. The sub pixel may be defective in a case where the sub pixel is only displayable in a black color.

The display panel 1 according to an embodiment of the disclosure may include an absorption layer 50 for absorbing an external light. The absorption layer 50 may be formed on a specific area, for absorbing an external light, excluding the area wherein a micro LED is mounted on the electrode 20. Here, the specific area may refer to an area wherein a micro LED is not mounted on the electrode 20. For example, the specific area may be an area excluding the areas wherein the first micro LED 41 and/or the second micro LED 42 are mounted on the electrode 20.

The display panel 1 according to various embodiments of the disclosure as described above can compensate detective pixels, and at the same time, minimize exposure of an electrode, and thereby enhance a contrast ratio, and can reduce occurrence of ESD.

Hereinafter, the display panel according to an embodiment of the disclosure will, be described in more detail with reference to FIGS. 1B and 1C.

Figure 1C:
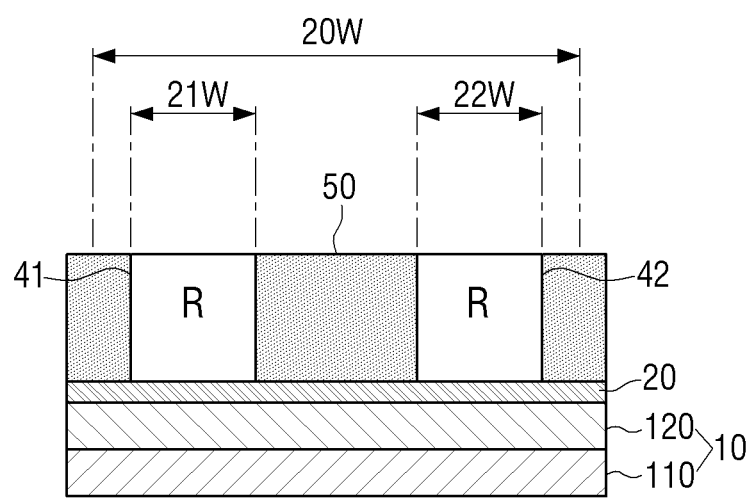
FIG. 1C is a sectional view for illustrating the display panel according to the embodiment of the disclosure more detail.

Referring to FIGS. 1B and 1C, the display panel 1 may include a driving circuit 120, an electrode 20, a first micro LED 41, a second micro LED 42, and an absorption layer 50. Also, the display panel 1 may include a plurality of pixels, and a pixel 30 from among the plurality of pixels may include a plurality of sub pixels 40. That is, each of the plurality of pixels may include a plurality of sub pixels 40.

The driving circuit 120 may be formed on the substrate 110. The substrate 110 may constitute the basic layer of the circuit board 10, and may be implemented in the form of a plate of which height is small compared to the width and the length, and implemented as materials having various properties such as a transparent property or a bending property. For example, the substrate 110 may comprise or consist of materials having a thickness of smaller than or equal to 1 mm which include polyimide (PI), glass, film, PET, metal foil, PVC, PMMA, etc.

Here, the driving circuit 120 may include a plurality of switching elements that respectively control a plurality of micro LEDs corresponding to the remaining sub pixels and the second micro LED 42.

Specifically, the driving circuit 120 may include a plurality of switching elements for selectively transmitting driving signals respectively controlling a micro LED (e.g.: a red LED) corresponding to a sub pixel (e.g.: an R sub pixel), and a plurality of micro LEDs (a green LED, a blue LED) corresponding to the remaining sub pixels (e.g.: a G sub pixel, a B sub pixel) from among the plurality of sub pixels 40 for forming the pixel 30. Here, a switching element may be implemented as, for example, a thin film transistor (TFT, not shown).

In this case, the driving circuit 120 may selectively transmit driving signals through switching elements for each of the plurality of micro LEDs, and accordingly, an sub pixel, a G sub pixel, and a B sub pixel may be displayed with individual brightness, and by a combination of the sub pixels, a pixel having a specific color and brightness may be constituted. Meanwhile, it is also possible that the driving circuit 120 is implemented as a plurality of circuits distinguished from one another, which respectively control the plurality of micro LEDs.

The driving circuit 120 illustrated in FIG. 1C, etc. is illustrated in a schematic form as a non-limiting example.

Accordingly, the circuit layer formed in the driving circuit 120 can be modified in various forms, and should not be limited to the schematic form illustrated. The electrode 20 is forded on the driving circuit 120, and may include a first area 21 and a second area 22. Here, the first area 21 may be an area wherein the first micro LED 41 for forming one of the sub pixels 40 is mounted, and the second area 22 may be an area wherein the second micro LED 42 will be mounted in case the one of the sub pixels 40 is defective.

Specifically, the electrode 20 is a conductor for electronically connecting the first micro LED 41 or the second micro LED 42 with the driving circuit 120, and may refer to a pixel electrode (or a driving electrode) applying a voltage to the first micro LED 41 or the second micro LED 42. For example, the electrode 20 may be implemented as various substances such as Cu, Au, Ag, ITO, etc.

Figure 3A:
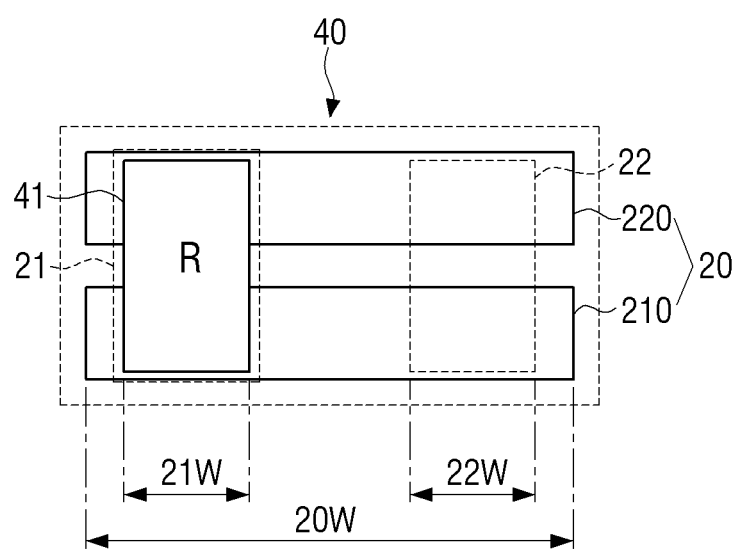
FIG. 3A is a plan view for illustrating a sub pixel according to an embodiment of the disclosure.

As an example, the electrode 20 may include a first electrode 210 (refer to FIG. 3A) and a second electrode 220 (refer to FIG. 3A). The first electrode 210 and the second electrode 220 may be electronically separated and separate voltages may be applied to them. For example, the first electrode 210 may comprise or consist of a cathode, and the second electrode 220 may comprise or consist of an anode. However, this is merely an example, and it is also possible that the first electrode 210 and the second electrode 220 are constituted vice versa.

Specifically, the first electrode 210 and the second electrode 220 may be arranged across the first area 21 and the second area 22. For example, the first electrode 210 and the second electrode 220 may be formed such that portions thereof overlap with the areas including the first area 21 and the second area 22.

Figure 3B:
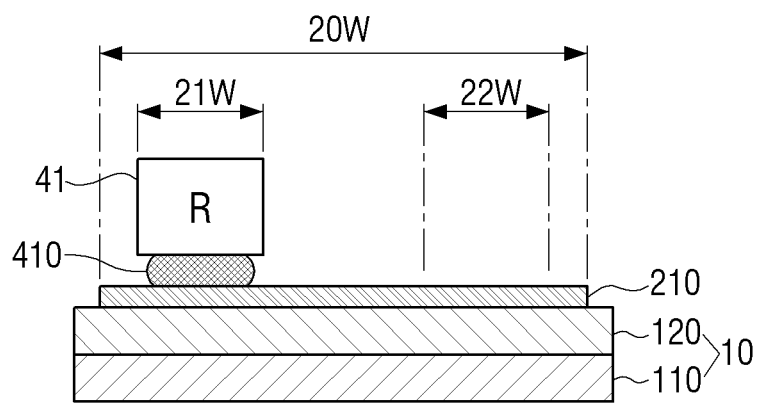
FIG. 3B is a sectional view for illustrating a sub pixel according to an embodiment of the disclosure.
Figure 3C:
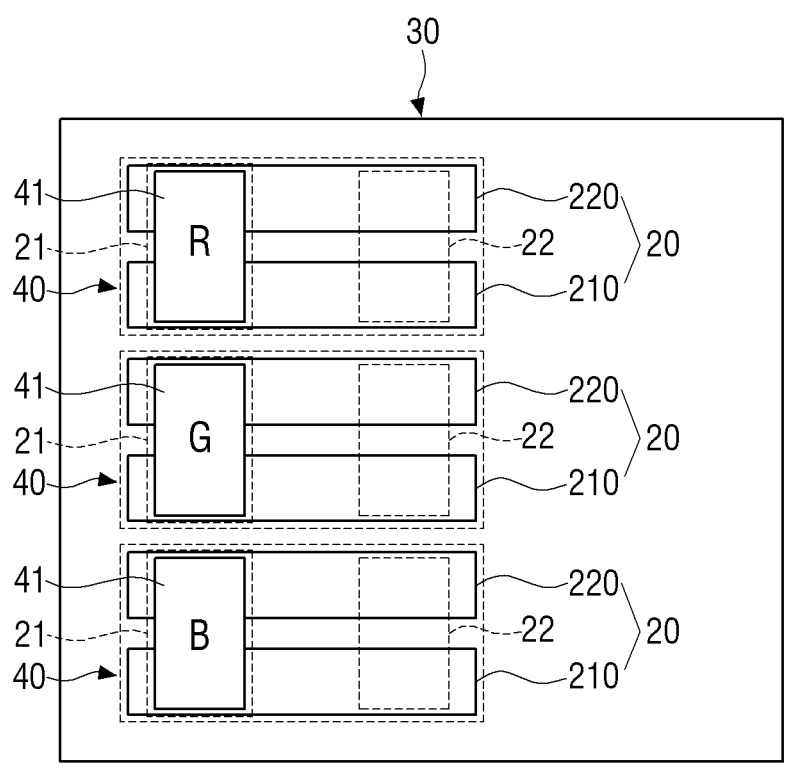
FIG. 3C is a plan view for illustrating a pixel according to an embodiment of the disclosure.

As an example, referring to FIG. 3C, the first electrode 210 and the second electrode 220 of an electrode 20 may be arranged in parallel with a plurality of electrodes connected with another micro LED for forming the pixel 30 together with the first micro LED 41.

Also, the first electrode 210 and the second electrode 220 may be arranged to have a predetermined interval. For example, the first electrode 210 and the second electrode 220 may be formed to be arranged such that they have a shorter interval than the length of both electrodes (or both terminals) formed on the first micro LED 41 or the second micro LED 42 mounted in the upper part.

Figure 10A:
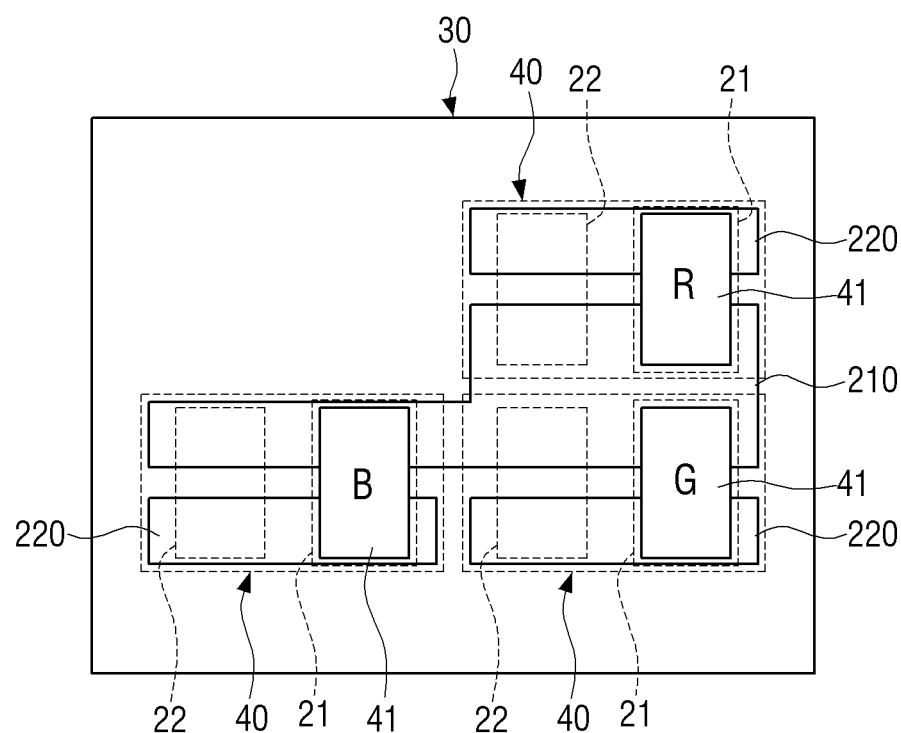
FIG. 10A is a sectional view for illustrating electrode structures according to various embodiments of the disclosure.

As another example, referring to FIG. 10A, the first electrode 210 is a common electrode commonly connected with another micro LED for forming the pixel 30 together with the first micro LED 41, and the second electrode 220 may be arranged to be adjacent to the first electrode 210.

For example, the first electrode 210 may be provided to commonly connect one end of each first micro LED 41 for forming the pixel 30 (here, 3 first micro LEDs), and a respective second electrode 220 may be independently provided for each of the sub pixels 40. In this case, to the one end of each first micro LED 41, the same voltage may be applied through the first electrode 210.

Meanwhile, according to an embodiment of the disclosure, the size of the electrode 20 is bigger than the size of each first micro LED 41, and the first area 21 and the second area 22 may be electronically connected with each other. Here, a size may refer to the length of one side according to the same direction (or the same axis). For example, a sin may refer to the length of one side according to the directions that the first micro LED 41 and the second micro LED 42 are arranged.

Specifically, referring to FIG. 1C, the length (20W) of one side of the electrode 20 may be bigger than the length (21W) of one side of the fast micro LED 41. For example, the length (20W) of one side of the electrode 20 may be bigger than the sum of the length (21W) of one side of the first micro LED 41 and the length (22W) of one side of the second micro LED 42. Here, if a case wherein the first micro LED 41 and the second micro LED 42 have the same size is assumed, the length (20W) of one side of the electrode 20 may be bigger than the N times of the length (21W) of one side of the first micro LED 41 (here, N is a natural number).

Figure 10B:
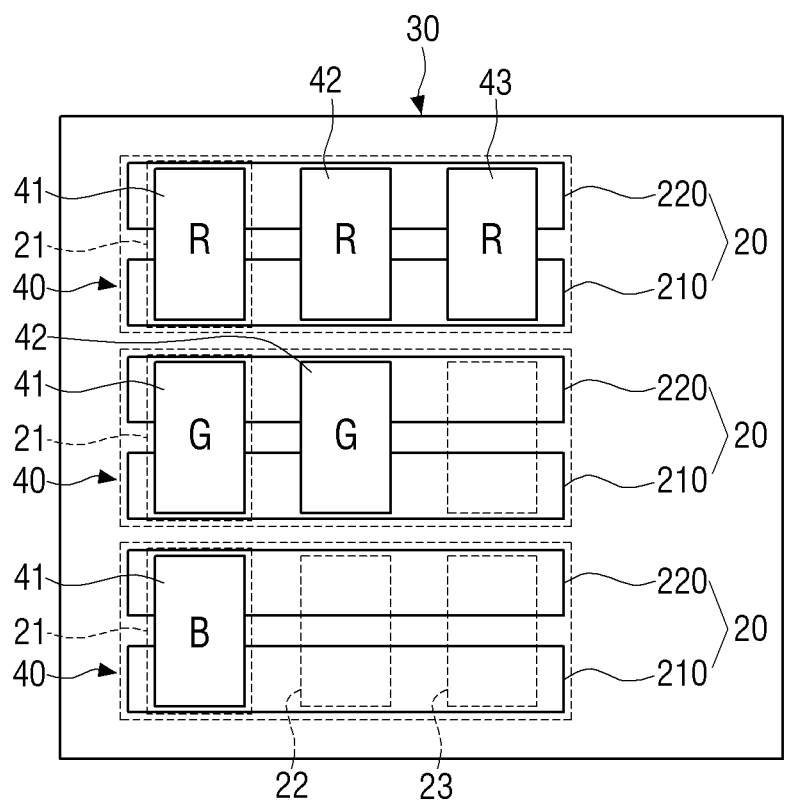
FIG. 10B is a sectional view for illustrating electrode structures according to various embodiments of the disclosure.

Here, according to an embodiment of the disclosure, if a case wherein N is 3 is assumed, it is also possible that the electrode 20 and the sub pixels 40 of the display panel 1 are implemented as illustrated in FIG. 10B.

Referring to FIG. 10B, if a case wherein both of the first and second micro LED 41, 42 are defective is assumed, a normal sub pixel may be constituted by mounting a third micro LED 43 on the electrode 20. For this, the electrode 20 may include a first area 21, a second area 22, and a third area 23, and the first to third areas 21, 22, 23 may be electronically connected with one another. Also, the size of the electrode 20 may be formed to be bigger than the sizes of the first to third micro LEDs 41, 42, 43.

In this case, each of the first to third micro LEDs 41, 42, 43 may be mounted on the first to third areas 21, 22, 23. For example, in case the sub pixel constituted by the first micro LED 41 mounted on the first area 21 of the electrode 20 is defective, the second micro LED 42 may be mounted on the second area 22, and in case the sub pixel constituted by the second micro LED 42 is defective, the third micro LED 43 may be mounted in the third area 23 to constitute a normal sub pixel. Also, all of the first to third micro LEDs 41, 42, 43 along a same electrode 20 may be light emitting devices designed to emit lights of the same color.

As described above, according to the number, arrangements, structures, etc. of the micro LEDs for forming the pixel 30, the size, arrangement, structure, etc. of the electrode 20 may be implemented while being modified in various ways.

Meanwhile, in FIG. 1C, etc. of the disclosure, it was illustrated that the first area 21 and the second area 22 have the same shape and size, but it is also possible that implementation is made such that the first area 21 and the second area 2 are modified in various ways to have different shapes and sizes. Further, it is also possible that implementation is made such that the remaining portion excluding the first area 21 and the second area 22 on the electrode 20 are modified in various ways to have different shapes and sizes.

The first micro LED 41 may be mounted on the first area 21. The first micro LED 41 is a semiconductor light emitting device of which width, length, and height respectively have a size of greater than or equal to 1 μm and smaller than or equal to 100 μm, and the semiconductor light emitting device may comprise or consist of a flip-chip structure wherein an electrode (not shown) is formed on the bottom surface of the semiconductor light emitting device.

Each first micro LED 41 may be, for example, one of a red LED, a green LED, or a blue LED. For example, in case the first micro LED 41 is a red LED, it may form one pixel 30 together with a green LED and a blue LED. In case the first micro LED 41 is mounted on the electrode 20 without a deft, it may emit a light having a specific color and brightness according to a driving signal of the driving circuit 120.

Meanwhile, in case a defect in, the device itself exists in the first micro LED 41 or a procedural defect exists in a process that the first micro LED 41 is mounted, the one of the sub pixels 40 constituted by the first micro LED 41 may become defective due to defects such as missing, open, or short, etc. For example, in this case, the one of the sub pixels 40 may always be displayed only in black.

The second micro LED 42 may be mounted on the second area 22. Here, in case the one of the sub pixels 40 constituted by the first micro LED 41 is detective, the second micro LED 42 may be mounted on the second area 22, and may constitute the pixel 30 together with the remaining sub pixels.

Here, the second micro LED 42 may replace the one of the sub pixels 40 constituted by the first micro LED 41 and constitute the pixel together with the remaining sub pixels.

In this case, the second micro LED 42 may be an LED emitting a light of the same color as the first micro LED 41. For example, in case the first micro LED 41 is a red LED, the second micro LED 42 may be a red LED.

The absorption layer 50 is formed on the remaining area excluding the areas wherein the first micro LED 41 and the second micro LED 42 are mounted and is a component for absorbing an external light.

Specifically, the absorption layer 50 may absorb a light, and may be visible, for example, in black. For example, the absorption layer 50 may comprise or consist of a black matrix (BM), a photosensitive resin composition, or a resin composition including a black pigment for shielding. Here, the absorption layer 50 may further include an antistatic agent for preventing occurrence of electro-static discharge (ESD).

Meanwhile, according to an embodiment of the disclosure, the height of the absorption layer 50 may be based on the height of the first micro LED 41 or the second micro LED 42, unlike what is illustrated in FIG. 1C. For example, implementation may be made in various modified forms, such as a case wherein the height of the absorption layer 50 is the same as the height of the first micro LED 41 or the second micro LED 42, or a case wherein the height of the absorption layer 50 is a value greater than or equal to 0.5 times and smaller than or equal to 1.5 times of the height of the first micro LED 41 or the second micro LED 42.

Further, it is also possible that the absorption layer 50 is formed to areas where the pixel 30 is not formed (or the areas wherein, the first micro LED 41 and the second micro LED 42 are mounted) on the circuit board 10. That is, the absorption layer 50 may be formed not only in a specific area of the electrode 20, but also to a portion of the circuit board on which the electrode 20 is not provided.

Hereinafter, a method of manufacturing the display panel 1 according to an embodiment of the disclosure will be described in detail with reference to the accompanying drawings.

FIG. 2 is a flow chart for illustrating a method of manufacturing a display panel according to an embodiment of the disclosure.

Referring to FIG. 2, the method of manufacturing the display panel 1 according to an embodiment of the disclosure may include the steps of forming a driving circuit 120 on a substrate 110 (S210), forming an electrode 20 including a first area 21 and a second area 22 on the driving circuit 120 (S220), mounting a first micro LED 41 for forming a sub pixel (one of the sub pixels 40) on the first area 21 (S230), forming an absorption layer 50 for absorbing an, external light on the second area 22 (S240), and based on the sub pixel (the one of the sub pixels 40) being defective, removing the absorption layer 50, and mounting a second micro LED 42 on the second area 22 (S250).

Referring to FIGS. 3A and 3B, in, the method of manufacturing the display panel 1 according to the disclosure, first, the driving circuit 120 may be formed on the substrate 110 at operation S210.

Specifically, the driving circuit 120 may be formed on the substrate 110 through various kinds of processes such as a low temperature poly silicon (UPS) process. Here, the substrate 110 constitutes the basic, layer of the circuit board 10, and may be implemented as a form of small plate of which height is small compared to the width and the length, and may be implemented as materials having various properties such as a transparent property or a bending property. For example, the substrate 110 may comprise or consist of materials having a thickness of smaller than or equal to 1 mm which include polyimide (PI), glass, film, PET, metal foil, PVC, PMMA, etc.

For example, the driving circuit 120 may be formed through processes of depositing amorphous silicon (a-Si) on the substrate 110 by using chemical deposition, and then changing the a-Si into Poly-Si through a crystallization process (excimer laser annealing, also known as ELA) using laser, and forming a pattern through photolithography with respect to the changed Poly-Si, and forming an insulating layer and a gate on the pattern, and then doping ions on the gate.

After the operation S210, the electrode 20 including the first area 21 and the second area 22 may be formed on the driving circuit 120 at operation S220. Here, the first area 21 may be an area wherein the first micro LED 41 for forming the one of the sub pixels 40 is mounted, and the second area 22 may be an area wherein the second micro LED 42 will be mounted in case the one of the sub pixels 40 is defective. Here, the electrode 20 may correspond to the one of the sub pixels 40 in that the sub pixel is constituted by the micro LEDs connected with the electrode 20. For example, the number of the electrodes, that are each an electrode 20, may have a 1:1 corresponding relation with the number of the sub pixels 40. In this case, each electrode 20 may include a respective first area 21 and a respective second area 22.

Here, the electrode 20 may include the first electrode 210 and the second electrode 220. Also, the first electrode 210 and the second electrode 220 may be electronically separated from each other, and separate voltages may be applied to them. For example, the first electrode 210 may comprise or consist of a cathode, and the second electrode 220 may comprise or consist of an anode. However; this is merely an example, and it is also possible that the first electrode 210 and the second electrode 220 are constituted vice versa.

The first electrode 210 and the second electrode 220 may be formed on the driving circuit 120 according to various methods such as lamination and deposition. Specifically, the first electrode 210 and the second electrode 220 may be arranged across the first area 21 and the second area 22. For example, the first electrode 210 and the second electrode 220 may be formed such that portions thereof overlap with the areas including the first area 21 and the second area 22.

As an example, referring to FIG. 3C, the first electrode 210 and the second electrode 220 of an electrode 20 may be arranged in, parallel with a plurality of electrodes connected with another micro LED for forming the pixel 30 together with the first micro LED 41 of the electrode 20.

Also, the first electrode 210 and the second electrode 220 may be arranged to have a predetermined interval. For example, the first electrode 210 and the second electrode 220 may be formed to be arranged such that they have a shorter interval than the length of both electrodes (or both terminals)

formed on the first micro LED 41 or the second micro LED 42 mounted in the upper part.

As another example, referring to FIG. 10A, the first electrode 210 is a common electrode commonly connected with another micro LED for forming the pixel 30 together with the first micro LED 41, and the second electrode 220 may be arranged to be adjacent to the first electrode 210.

For example, the first electrode 210 may be provided to commonly connect one end of each first micro LED 41 for forming the pixel 30 (here, 3 first micro LEDs), and a respective second electrode 220 may be independently provided for each of the sub pixels 40. In this case, to the one end of each first micro LED 41, the same voltage may be applied through the first electrode 210.

Meanwhile, according to an embodiment of the disclosure, the size of the electrode 20 is bigger than the size of each first micro LED 41, and the first area 21 and the second area 22 may be electronically connected with each other. As the first area 21 and the second area 22 included in the same electrode 20 are for constituting one sub pixel, they may correspond to each other.

As described above, the method of forming the electrode 20 may be implemented while being modified in various forms, according to at least one of the number, the locations, the arrangements, or the colors of the sub pixels 40.

After the operation S220, the first micro LED 41 for forming the one of the sub pixels 40 may be mounted on the first area 21 at operation S230. As an example, the first micro. LED 41 may be constituted as a flip-chip structure wherein all electrodes of the first micro LED 41 are formed in the lower part. Meanwhile, the first micro LED 41 may be one of a plurality of micro LEDs, and the plurality of micro LEDs may be mounted on the respective first areas corresponding to the plurality of micro LEDs.

Specifically, a first bonding part 410 may be applied on the first area 21 of the electrode 20, and then the first micro LED 41 may be arranged (or transferred) on the applied first bonding part 410. For example, the first micro LED 41 may be arranged for transferred) on the applied first bonding part 410 by using Electrostatic Head, X-Celeprint, Pick up Heads, Elastomer Transfer priming methods, etc.

Here, the first bonding part 410 is a component for fixing the arranged first micro LED 41, and electronically connecting the driving circuit 120 and the first micro LED 41. For example, the first bonding, part 410 may connect the electrodes of each of the driving circuit 120 and the first micro LED 41. For this, the first bonding part 410 may be implemented as a conductive resin, and may be cured or plasticized by heat of a high or low temperature. For example, the first bonding part 410 may be implemented as a material wherein one of metals such as Al, Cu, Sn, Au, Zn, Pb, etc. or a mixture or an alloy of at least two of them are mixed with powders having an average particle diameter of 0.1 μm to 10 μm, a paste having viscosity or a binder resin.

In this case, the first bonding part 410 may be cured through various methods such as a reflow process, a thermocompression process, etc., and the first micro LED 41 may be mounted on the first area 21.

A configuration wherein a respective first micro LED 41 for forming each of the plurality of sub pixels 40 are mounted on a first area 21 of an electrode 20 according to the steps as described above are illustrated in FIG. 3C.

After the operation S230, the absorption layer 50 for absorbing an external light may be formed on the second area 22 at operation S240.

As a specific embodiment, the absorption layer 50 may be formed on the second area 22 of the electrode 20 through processes of applying a liquefied composition on the electrode 20 or attaching a composition in the form of film on the electrode 20, and exposing or developing a specific area of the attached composition. As another example, the absorption layer 50 may be formed by applying a liquefied composition on the second area 22 of the electrode 20 through an inkjet process, etc., and curing the applied composition.

Figure 4A:
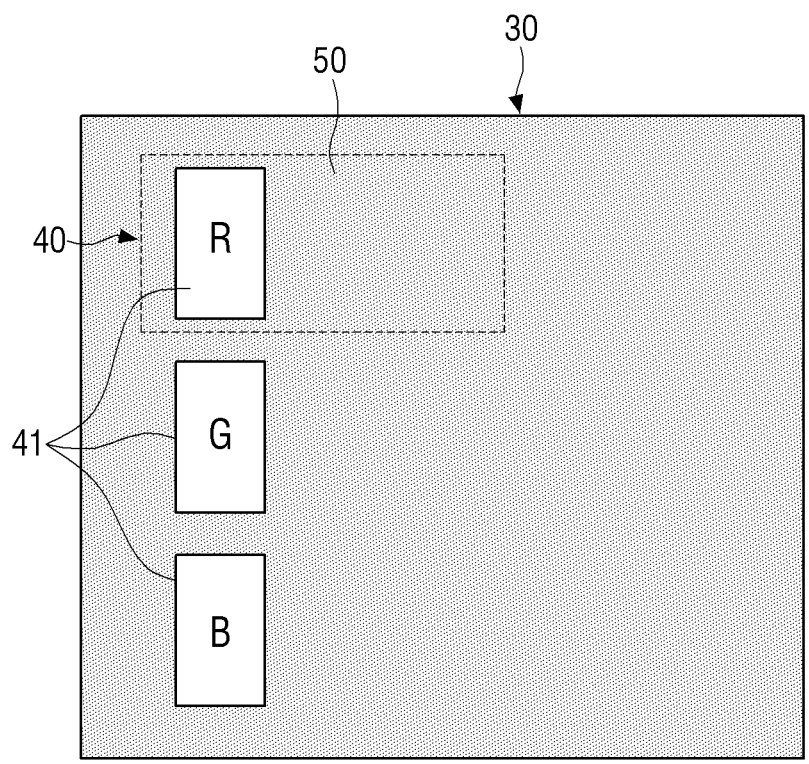
FIG. 4A is a plan view for illustrating a method of manufacturing a display panel by compensating pixels which are defective according to an embodiment of the disclosure.
Figure 4B:
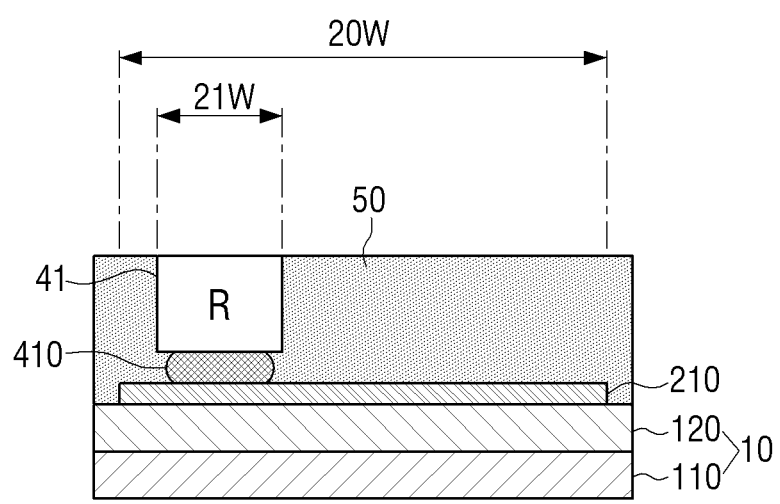
FIG. 4B is a sectional view for illustrating the method of manufacturing the display panel by compensating pixels which are defective according to the embodiment of the disclosure.

However, this is merely an example, and an area wherein the absorption layer 50 is formed may include another area as well as the second area 22, as illustrated in FIGS. 4A and 4B. For example, an area wherein the absorption layer 50 is formed may be all or some of the area its which the first micro LED 41 is not mounted on the electrode 20, or may further include an area other than the electrode 20. As described above, an area wherein the absorption layer 50 is formed may be implemented while being modified in various forms according to the structure, size, and, exposed area of the electrode 20.

Also, referring to FIGS. 4A and 4B, the absorption layer 50 may be formed based on the height of one or more first micro LED 41. For example, implementation may be made in various modified forms, such as a case wherein the height of the absorption layer 50 is the same as the height of one or more first micro LED 41, or a case wherein the height of the absorption layer 50 is a value greater than or equal to 0.5 times and smaller than or equal to 1.5 times of the height of one or more first micro LED 41. Alternatively, it is also possible that the absorption layer 50 is formed to have a height of a predetermined value (e.g., 1 μm, etc.).

Meanwhile, in FIG. 4B, it is illustrated that the height of the absorption layer 50 is as high as the height at which the first micro LED 41 is mounted. For example, a top surface of the first micro LED 41 is a same height as a top surface of the absorption layer 50. However, this is merely an example, and it is also possible that the absorption layer 50 is formed to have a height modified based on the height at which the first micro LED 41 is mounted.

Meanwhile, the absorption layer 50 may be formed on every second area included on each of the plurality of electrodes corresponding to the plurality of sub pixels.

After the operation S240, if one of the sub pixels 40 is defective, the absorption layer 50 may be removed, and the second micro LED 42 may be mounted on the second area 22 at operation S250.

Figure 5A:
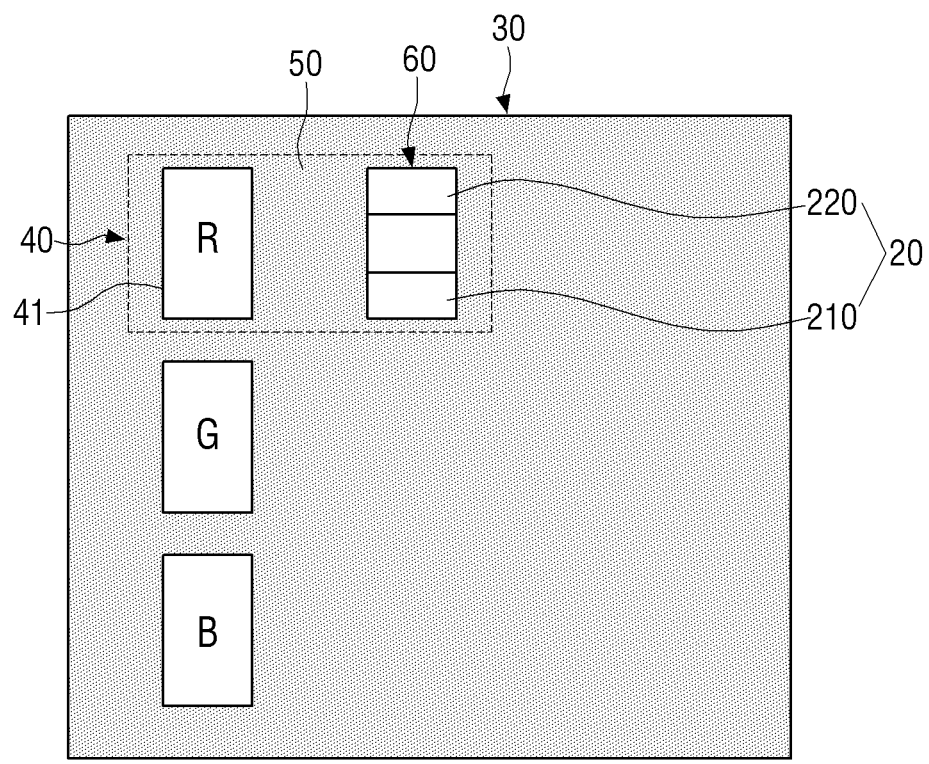
FIG. 5A is a plan view for illustrating the method of manufacturing the display panel by compensating pixels which are defective according to the embodiment of the disclosure.
Figure 5B:
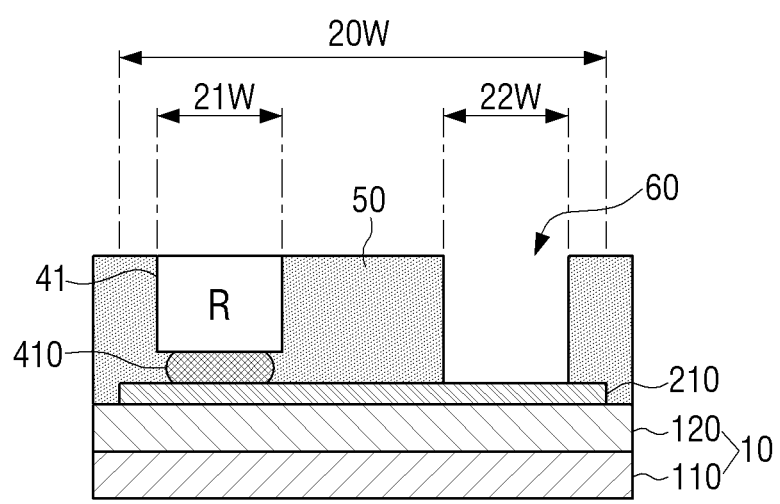
FIG. 5B is a sectional view for illustrating the method of manufacturing the display panel by compensating pixels which are defective according to the embodiment of the disclosure.

Specifically, referring to FIGS. 5A and 5B, if one of the sub pixels 40 is defective, the absorption layer 50 formed on the second area 22 may be removed.

For this, after the operation S240, the manufacturing method according to an embodiment of the disclosure may further include a step of inspecting whether the one of the sub pixels 40 constituted by the first micro LED 41 is defective. For example, it may be identified whether the one of the sub pixels 40 is defective through various methods such as detecting the wavelength of the light emitted from the first micro LED 41 by using electroluminescence (EL) or applying an electronic signal. Here, the identified sub pixel may be one, or a plurality of sub pixels in a specific unit, or all sub pixels.

Here, in case a specific one of the sub pixels 40 from among the plurality of sub pixels is defective, identification information for the defective one of the sub pixels 40 (e.g., location information of the micro LED or the electrode corresponding to the defective one of the sub pixels 40, etc.) may be acquired.

Hereinafter, explanation will be made based on the assumption of a case wherein the one of the sub pixels 40 constituted by the first micro LED 41 which is a red LED is defective.

In this case, if the one of the sub pixels 40 constituted by the first micro LED 41 is defective, the absorption layer 50 formed on the second area 22 may be removed.

Specifically, based on the acquired identification information, the absorption layer 50 formed on the second area 22 of the electrode 20, corresponding to the one of the sub pixels 40 which is defective, from among the plurality of electrodes may be removed. For example, in case one of the sub pixels 40 corresponding to the coordinate of (10, 20) is defective, the absorption layer 50 formed on the second area 22 of the electrode 20 corresponding to the one of the sub pixels 40 may be removed.

In this case, the absorption layer 50 may be removed by various methods such as photolithography using UV, etc., etching, and the like. Also, an area 60 from which the absorption layer 50 was removed may be based on the size of the second micro LED 42, and for example, the size of the area 60 from which the absorption layer 50 was removed may be bigger than or the same as the size of the second micro LED 42.

Accordingly, in the area 60 from which the absorption layer 50 was removed the second area 22 of the electrode 20 may be exposed. Here, the area 60 from which the absorption layer 50 was removed may include the second area 22. That is, the area 60 from which the absorption layer 50 was removed may be an area that is bigger than or the same size as the second area 22 of the electrode 20.

Figure 6A:
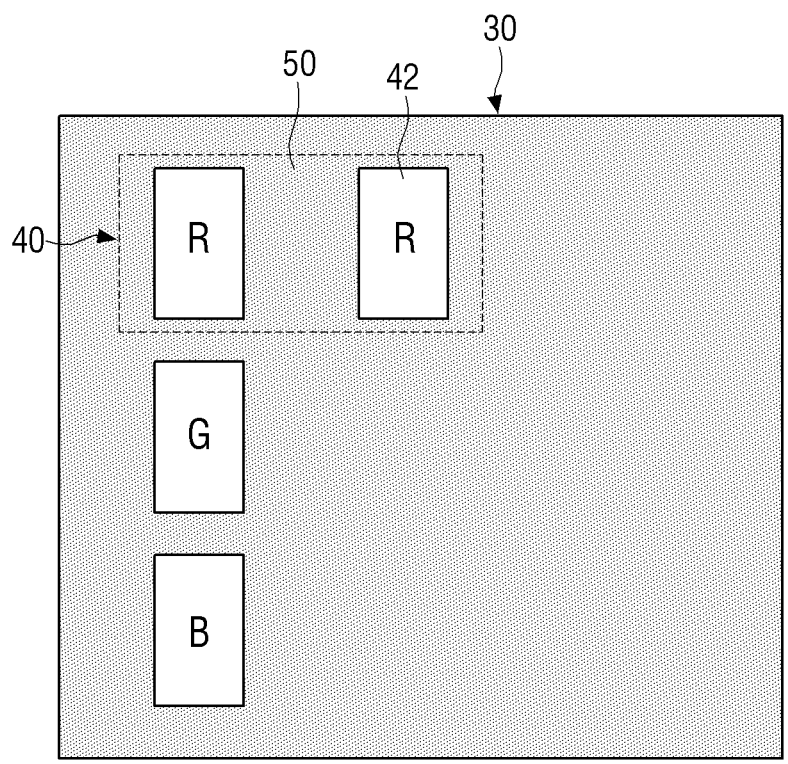
FIG. 6A is a plan view for illustrating the method of manufacturing the display panel by compensating pixels which are defective according to the embodiment of the disclosure.
Figure 6B:
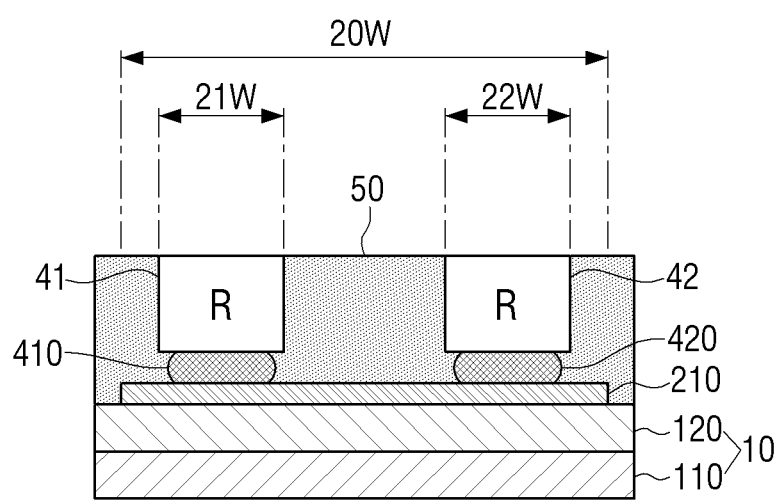
FIG. 6B is a sectional view for illustrating the method of manufacturing the display panel by compensating pixels which are defective according to the embodiment of the disclosure.

Afterwards, referring to FIGS. 6A and 6B, the second micro LED 42 may be mounted on the second area 22 from which the absorption layer 50 was removed. Here, the second micro LED 42 may be an LED emitting a light of the same color as the first micro LED 41. Also, with respect to the method of mounting the second micro LED 42, explanation regarding the aforementioned method of mounting the first micro LED 41 can be applied in the same manner, and thus overlapping descriptions will be omitted. Meanwhile, the manufacturing method according to various embodiments of the disclosure may further include the steps of removing the first micro LED 41 and forming the absorption layer 50 on the first area 21 exposed according to removal of the first micro LED 41.

For example, only one first micro LED 41 for forming a sub pixel which is defective from among the plurality of first micro LEDs may be removed through, a laser method, and separated from the electrode 20. In this case, by forming the absorption layer 50 on the first area 21 exposed according to removal of the one micro LED 41, it can be prevented that the electrode 20 becomes visible, and occurrence of ESD can be reduced.

Meanwhile, in the aforementioned embodiment, it was explained that the absorption layer 50 is formed first, and then, in case the one of the sub pixels 40 formed by the one micro LED 41 is defective, the absorption layer 50 formed on the second area 22 is removed and the second micro LED 42 is, mounted. However, as a different method from the above, the second micro LED 42 is mounted, and then the absorption layer 50 may be formed on the all or some of the areas in which the first micro LED 41 and the second micro LED 42 are not mounted on the electrode 20. Specific, contents regarding such an embodiment will be explained together with reference to FIG. 7.

Referring to FIG. 7, a method of manufacturing the display panel 1 according to various embodiments of the disclosure includes the steps of forming a driving circuit 120 on a substrate 110 (S710), forming an electrode 20 including a first area 21 and a second area 22 on the driving circuit 120 (S720), mounting a first micro LED 41 for forming a sub pixel (one of the sub pixels 40) on the first area 21 (S730), based on the sub pixel (the one of the sub pixels 40) being defective, mounting a second micro LED 42 on the second area 22 (S740), and forming an absorption layer 50 for absorbing an external light on all or some of the areas in which the first micro LED 41 and the second micro LED 42 are not mounted on the electrode 20 (S750).

Here, the size of the electrode 20 may be bigger than the size of the first micro LED 41, and the first area 21 and the second area 22 may be electronically connected with each other. Also, the electrode 20 may include a first electrode 210 and a second electrode 220, and the first electrode 210 and the second electrode 220 may be arranged across the first area 21 and the second area 22. In addition, the first electrode 210 may be a common electrode commonly connected with another micro LED far forming the pixel 30 together with the first micro LED 41, and here, the second electrode 220 may be arranged to be adjacent to the first electrode 210.

Here, the explanations above regarding the operations S210 to S230 can be applied in the same manner to the operations S710 to S730, and thus overlapping descriptions will be omitted. Also, specific descriptions recording the operations S740 to S750 will be explained together with FIGS. 8A to 9B.

After the operation S730, if one of the sub pixels 40 is defective, the second micro LED 42 may be mounted on the second area 22 at operation S740.

For this, after the operation S730, the manufacturing method according to an embodiment of the disclosure may further include a step of inspecting whether the one of the sub pixels 40 formed by the first micro LED 41 is defective. For example, it may be identified whether the one of the sub pixels 40 is defective through various methods such as detecting the wavelength of the light emitted from the first micro LED 41 by using electroluminescence (EL) or applying an electronic signal. Here, the identified sub pixel may be one, or a plurality of sub pixels in a specific unit, or all sub pixels.

Here, in case a specific one of the sub pixels 40 from among the plurality of sub pixels is defective, identification information for the defective one of the sub pixels 40 (e.g., location information of the micro LED or the electrode corresponding to the defective one of the sub pixels 40, etc.) may be acquired.

Hereinafter, explanation will be made based on the assumption of a case wherein the one of the sub pixels 40 formed by the first micro LED 41 which is a red LED is defective.

Figure 8A:
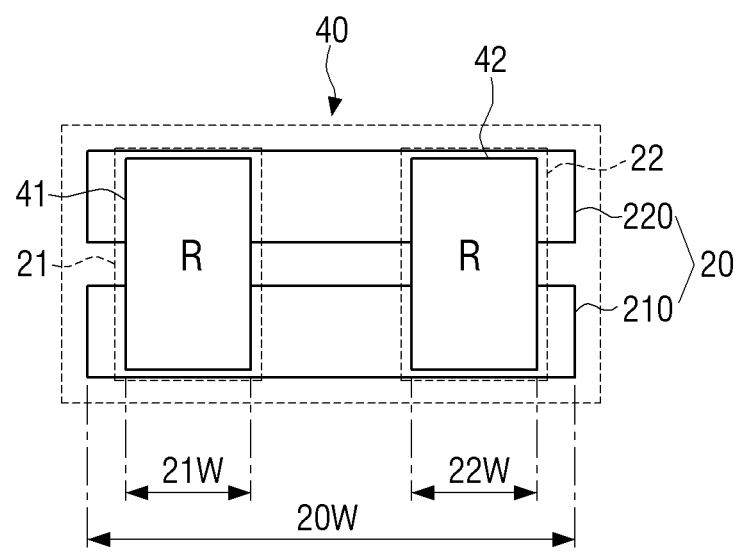
FIG. 8A is a plan view for illustrating the method of manufacturing the display panel by compensating pixels which are defective according to the another embodiment of the disclosure.
Figure 8B:
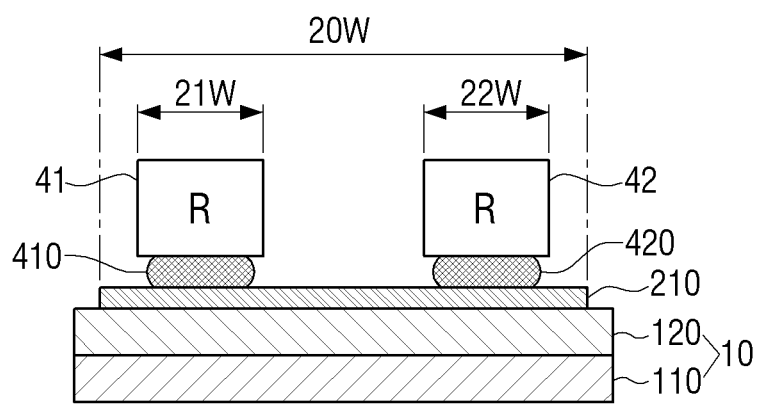
FIG. 8B is a sectional view for illustrating the method of manufacturing the display panel by compensating pixels which are defective according to the another embodiment of the disclosure.

Specifically, referring to FIGS. 8A and 8B, based on the acquired identification information, the second micro LED 42 may be mounted on the second area 22 of the electrode 20 corresponding to the one of the sub pixels 40 which is defective from among the plurality of electrodes. For example, in case the one of the sub pixels 40 corresponding to the coordinate of (10, 20) is defective, the second micro LED 42 may be mounted on the second area 22 of the electrode 20 corresponding to the one of the sub pixels 40.

Here, the second micro LED 42 may be an LED emitting a light of the same color as the first micro LED 41. Also, with respect to the step of mounting the second micro LED 42, explanation regarding the aforementioned step of mounting the first micro LED 41 can be applied in the same manner, and thus overlapping descriptions will be omitted.

After the operation S740, the absorption layer 50 for absorbing an external light may be formed on the remaining area excluding the areas wherein the first micro LED 41 and the second micro LED 42 are mounted on the electrode 20 at operation S750.

Figure 9A:
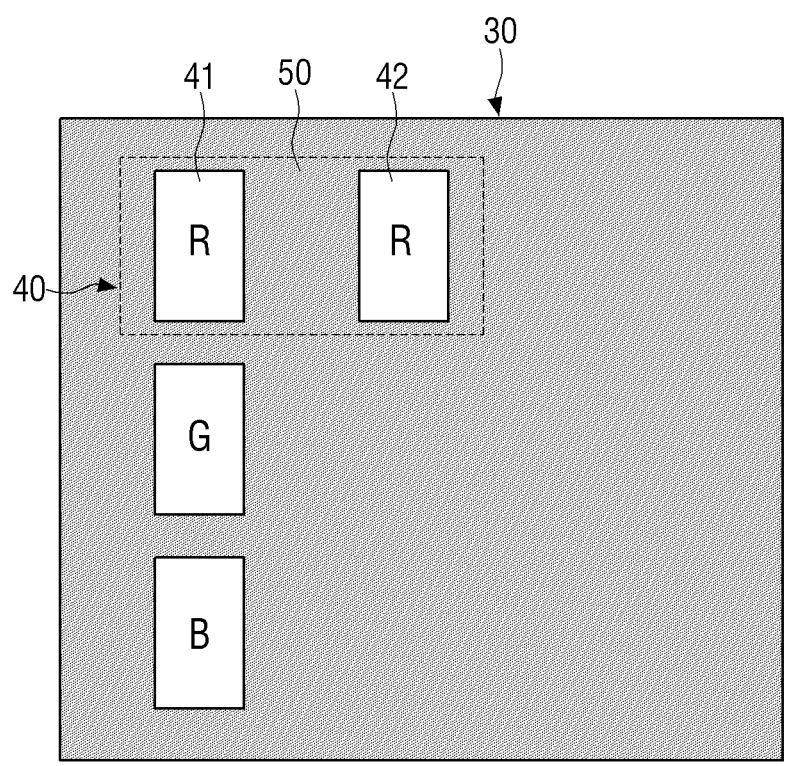
FIG. 9A is a plan view for illustrating the method of manufacturing the display panel by compensating pixels which are defective according to the another embodiment of the disclosure.
Figure 9B:
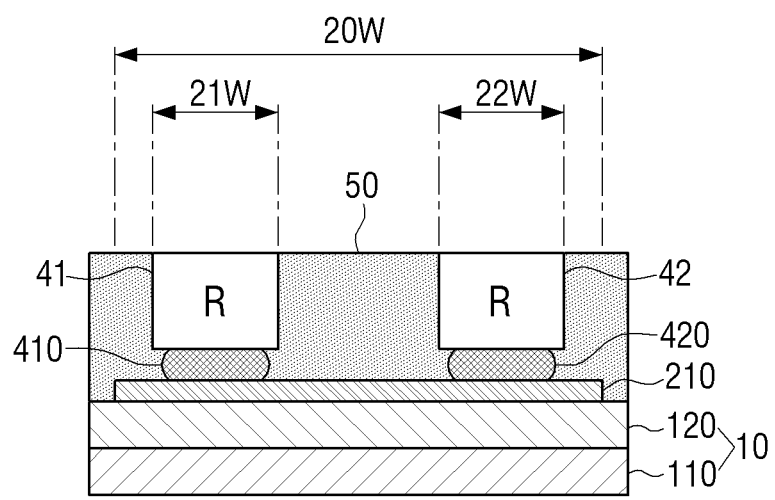
FIG. 9B is a sectional view for illustrating the method of manufacturing the display panel by compensating pixels which are defective according to the another embodiment of the disclosure.

Referring to FIGS. 9A and 9B, the absorption layer 50 may be formed on the all or some of the areas in which the first micro LED 41 and the second micro LED 42 are not mounted on the electrode 20.

For example, the absorption layer 50 may be formed on the area of a top surface of the circuit board 10 (or the electrode 20) and not formed on the areas of a top surface of the circuit board 10 (or the electrode 20) where the first micro LED 41 and the second micro LED 42 are mounted on the electrode 20 through processes of applying a liquefied composition on the electrode 20 or attaching a composition in the form of film on the electrode 20, and exposing or developing a specific area of the attached composition. As another example, the absorption layer 50 may be formed by applying a liquefied composition only in the area where the first micro LED 41 and the second micro LED 42 are not mounted on the electrode 20 through an inkjet process, etc., and curing the applied composition. However, this is merely an example, and the absorption layer 50 may be formed through various modified embodiments.

Here, the absorption layer 50 may be formed based on the height of the first micro LED 41 or the second micro LED 42. For example, implementation may be made in various modified forms, such as a case wherein the height of the absorption layer 50 is the same as the height of the first micro LED 41 or the second micro LED 42, or a case wherein the height of the absorption layer 50 is a value greater than or equal to 0.5 times and smaller than or equal to 1.5 times of the height of the first micro LED 41 or the second micro LED 42.

Meanwhile, the manufacturing method according to various embodiments of the disclosure may further include the steps of removing the first micro LED 41 and forming the absorption layer 50 on the first area 21 exposed according to removal of the first micro LED 41.

For example, only one micro LED 41 for forming a sub pixel which is defective from among the plurality of first micro LEDs may be removed through a laser method, and separated from the electrode 20. In this case, by forming the absorption layer 50 on the first area 21 exposed according to removal of the one micro LED 41, it can be prevented that the electrode 20 becomes visible, and occurrence of ESD can be reduced.

According to various embodiments of the disclosure as described above, a display panel for compensating defective pixels and a manufacturing method thereof can be provided. Also according to various embodiments of the disclosure a display panel that can compensate defective pixels, and at the same time, minimize exposure of an electrode, and thereby enhance a contrast ratio, and a manufacturing method thereof can be provided. In addition, according to various embodiments of the disclosure, a display panel that can compensate defective pixels, and at the same time, minimize exposure of an electrode, and thereby reduce occurrence of electro-static discharge (ESD), and a manufacturing method thereof can be provided.

According to various embodiments of the disclosure as described above, a display panel for compensating defective pixels and a manufacturing method thereof can be provided.

Also, according to various embodiments of the disclosure, a display panel that can compensate defective pixels, and at the same time, minimize exposure of an electrode and thereby enhance a contrast ratio, and a manufacturing method thereof can be provided.

In addition, according to various embodiments of the disclosure, a display panel that can compensate defective pixels, and at the same time, minimize exposure of an electrode, and thereby reduce occurrence of electro-static discharge (ESD), and a manufacturing method thereof can be provided.

A display module according to embodiments of the disclosure may be applied while being installed on a wearable device, a portable device, a handheld device, and various types of electronic products or electronic components which need displays in a single unit, and may be applied to display devices such as a monitor fro a personal computer (PC), a high-resolution TV, signage, electronic signage, etc. as a matrix type through a plurality of assembly arrangements.

Further, each of the components according to the aforementioned various embodiments (e.g.: a module or a program) may comprise or consist of a singular object or a plurality of objects. Also, from among the aforementioned corresponding sub components, some sub components may be omitted, or other sub components may be further included in the various embodiments. Generally or additionally, some components (e.g.: a module or a program) may be integrated as an object, and perform the functions that were performed by each of the components before integration identically or in a similar manner. Operations performed by a module, a program, or other components according to the various embodiments may be executed sequentially, in parallel, repetitively, or heuristically. Or, at least some of the operations may be executed in a different order or omitted, or other operations may be added.

What is claimed is:

1. A method of manufacturing a display panel including a plurality of pixels, each pixel of the plurality of pixels including a plurality of sub pixels, the method comprising:
    forming a driving circuit on a substrate;
    forming a plurality of electrodes that correspond to the plurality of sub pixels of a pixel of the plurality of pixels, respectively, on the driving circuit, wherein each electrode of the plurality of electrodes includes a first area and a second area separated from the first area;
    mounting a plurality of first micro Light Emitting Diodes (LEDs), for forming a respective sub pixels of the pixel, on the first area of each of the plurality of electrodes so that each of the plurality of first micro LEDs is separated from the second area of each of the plurality of electrodes;
    forming an absorption layer on the second area of each of the plurality of electrodes, the absorption layer configured to absorb an external light;
    identifying a defective sub pixel among the plurality of sub pixels of the pixel;
    removing, based on the defective sub pixel being identified, a portion of the absorption layer corresponding to a region of the second area of one of the plurality of electrodes that corresponds to the defective sub pixel;
    mounting, after removing the absorption layer, a second micro LED on the second area of an electrode of the plurality of electrodes that corresponds to the defective sub pixel;
    removing a first micro LED from among the plurality of first micro LEDs that forms the defective sub pixel; and forming the absorption layer on the first area exposed due to removal of the first micro LED of the defective sub pixel.

2. The method of claim 1,
wherein the second micro LED is configured to emit a light of a same color as light in which the first micro LED is configured to emit when the first micro LED is in a state to form a sub pixel without defect.

3. The method of claim 1,
wherein a size of the one of the plurality of electrodes is bigger than a size of the first micro LED, and
the first area and the second area of the one of the plurality of electrodes are electronically connected with each other.

4. The method of claim 1,
wherein the one of the plurality of electrodes includes a first electrode and a second electrode, and
the first electrode and the second electrode are both arranged across the first area and the second area.

5. The method of claim 4,
wherein the first electrode is a common electrode commonly connected with two of the plurality of first micro LEDs for forming the pixel, and
the second electrode is arranged adjacent to the first electrode.

6. The method of claim 4,
wherein the first electrode and the second electrode are arranged in parallel.

* * * * *